United States Patent
Lee et al.

(10) Patent No.: US 11,526,087 B2
(45) Date of Patent: Dec. 13, 2022

(54) METHOD OF MANUFACTURING A SEMICONDUCTOR DEVICE

(71) Applicant: Samsung Electronics Co., Ltd., Suwon-si (KR)

(72) Inventors: Jeongjin Lee, Hwaseong-si (KR); Doogyu Lee, Ansan-si (KR); Seungyoon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/401,611

(22) Filed: Aug. 13, 2021

(65) Prior Publication Data

US 2022/0214624 A1 Jul. 7, 2022

(30) Foreign Application Priority Data

Jan. 5, 2021 (KR) ........................ 10-2021-0000988

(51) Int. Cl.
 *G03F 7/20* (2006.01)
 *G03F 9/00* (2006.01)
 *H01L 21/027* (2006.01)

(52) U.S. Cl.
 CPC ............ *G03F 7/70633* (2013.01); *G03F 7/20* (2013.01); *G03F 7/705* (2013.01); *G03F 9/7088* (2013.01); *H01L 21/0274* (2013.01)

(58) Field of Classification Search
 CPC ........ G03F 7/20; G03F 7/705; G03F 7/70633; G03F 9/7088; H01L 21/0274
 See application file for complete search history.

(56) References Cited

U.S. PATENT DOCUMENTS

| | | | |
|---|---|---|---|
| 6,163,366 A * | 12/2000 | Okamoto | ............ G03F 7/70883 355/53 |
| 7,799,166 B2 | 9/2010 | Whitefield | |
| 9,436,080 B2 | 9/2016 | Beyer et al. | |
| 9,766,559 B2 | 9/2017 | Lee et al. | |
| 9,786,569 B1 | 10/2017 | Ho et al. | |
| 10,133,193 B2 | 11/2018 | Coskun et al. | |
| 10,527,958 B2 | 1/2020 | Tinnemans et al. | |
| 10,733,354 B2 | 8/2020 | Kim et al. | |
| 2002/0111038 A1* | 8/2002 | Matsumoto | ......... G03F 7/70633 438/763 |
| 2003/0003384 A1* | 1/2003 | Hoshi | ................... G03F 9/7046 430/30 |
| 2003/0091914 A1* | 5/2003 | Cho | .................... G03F 7/70633 430/30 |

(Continued)

*Primary Examiner* — Deoram Persaud
(74) *Attorney, Agent, or Firm* — Muir Patent Law, PLLC

(57) ABSTRACT

A method of manufacturing a semiconductor device is provided. The method includes transferring an internal shot and an external shot by performing a patterning process on a first wafer, analyzing an overlay of the first wafer, and performing a lithography process on a second wafer, based on the analyzing of the overlay of the first wafer, wherein the analyzing of the overlay of the first wafer includes providing, to the first region, first augmented overlays generated based on an orthogonal coordinate system using first and second directions perpendicular to each other as an axis, and providing, to the second region, second augmented overlays that are overlays in a radial direction from the center of the first wafer.

20 Claims, 11 Drawing Sheets

(56) References Cited

U.S. PATENT DOCUMENTS

| | | | | |
|---|---|---|---|---|
| 2003/0098977 A1* | 5/2003 | Kim | ................... | G03F 7/70633 |
| | | | | 356/401 |
| 2006/0238761 A1* | 10/2006 | Lin | ................... | G03F 7/70633 |
| | | | | 356/401 |
| 2015/0116686 A1* | 4/2015 | Lee | ..................... | G03F 9/7046 |
| | | | | 355/72 |
| 2015/0170904 A1* | 6/2015 | Tsen | .................... | G03F 9/7003 |
| | | | | 355/53 |
| 2016/0246185 A1* | 8/2016 | Ypma | ................. | G03F 7/70508 |
| 2016/0334717 A1* | 11/2016 | Wildenberg | ........ | G03F 7/70633 |
| 2017/0017166 A1* | 1/2017 | Lee | ................... | G03F 7/70633 |
| 2019/0094721 A1* | 3/2019 | Tinnemans | .......... | G03F 7/70641 |
| 2020/0233312 A1* | 7/2020 | Kim | ................ | H01L 21/67259 |
| 2021/0080837 A1* | 3/2021 | Rijpstra | .............. | G03F 7/70525 |
| 2021/0157247 A1* | 5/2021 | Ypma | ................. | G03F 7/70616 |
| 2021/0216021 A1* | 7/2021 | Demirer | ............. | G03F 7/70633 |
| 2021/0263427 A1* | 8/2021 | Li | ...................... | G03F 7/70258 |
| 2022/0291590 A1* | 9/2022 | Su | ........................... | G03F 7/705 |

\* cited by examiner

METHOD OF MANUFACTURING A SEMICONDUCTOR DEVICE

CROSS-REFERENCE TO RELATED APPLICATION

This application is based on and claims priority under 35 U.S.C. § 119 to Korean Patent Application No. 10-2021-0000988, filed on Jan. 5, 2021, in the Korean Intellectual Property Office, the disclosure of which is incorporated by reference herein in its entirety.

BACKGROUND

The inventive concept relates to a method of manufacturing a semiconductor device. More particularly, the inventive concept relates to a method of manufacturing a semiconductor device having an improved reliability and an improved manufacturing yield.

With a reduction in a memory cell size for recent high integration of information communication devices, operations of memory devices and structures of operational circuits and/or interconnection lines included in the memory devices become more complicated. Accordingly, application of an extreme ultraviolet (EUV) lithography is increasing in the manufacture of semiconductor devices. The EUV lithography uses light having a wavelength in a range of, for example, 4 nm to 124 nm, more preferably, a wavelength of 13.5 nm, and enables superfine dimension processing of 20 nm or less (sub-20 nm) that is difficult to implement according to an existing lithography technique using ArF excimer laser light.

A feedback process through highly-reliable and highly-precise overlay measurement and analysis is one of the core elements for securing the reliability of the EUV lithography. Thus, various research into improving the precision and reliability of overlay measurement is being carried out.

SUMMARY

The inventive concept provides a method of manufacturing a semiconductor device having an improved reliability and an improved manufacturing yield.

Additional aspects will be set forth in part in the description which follows and, in part, will be apparent from the description, or may be learned by practice of the presented embodiments.

According to an aspect of the inventive concept, there is provided a method of manufacturing a semiconductor device. The method includes transferring an internal shot and an external shot by performing a lithography process and a patterning process based on the lithography process on a first wafer, wherein the internal shot is within a critical radius from a center of the first wafer, and the external shot includes a first region within the critical radius from the center of the first wafer and a second region outside the critical radius; measuring an overlay of the first wafer patterned by the patterning process; analyzing the overlay of the first wafer; and performing a lithography process on a second wafer, based on the analyzing of the overlay of the first wafer. The analyzing of the overlay of the first wafer includes providing, to the first region, first augmented overlays generated based on an orthogonal coordinate system using first and second directions perpendicular to each other as an axis; and providing, to the second region, second augmented overlays that are overlays in a radial direction from the center of the first wafer.

According to another aspect of the inventive concept, there is provided a method of manufacturing a semiconductor device. The method includes transferring a circuit pattern on an extreme ultraviolet (EUV) photomask to a photoresist layer formed on a wafer, wherein a plurality of shots that are portions of the wafer to which the circuit pattern on the EUV photomask has been transferred include a first region within a critical radius from a center of the wafer and a second region outside the critical radius; forming a photoresist pattern having a shape corresponding to the EUV photomask, by developing the photoresist; and inspecting the photoresist pattern. The inspecting of the photoresist pattern includes measuring overlays indicating misalignment between a pattern formed below a photoresist of the second region and the photoresist pattern; processing the overlays of the second region such that the overlays of the second region are parallel to a radial direction; and providing, to a plurality of locations on the second region, first augmented overlays in the radial direction from the center of the wafer, based on the processed overlays.

According to another aspect of the inventive concept, there is provided a method of manufacturing a semiconductor device. The method includes transferring a circuit pattern on a photomask to a wafer, wherein each of a plurality of shots that are portions of the wafer to which the circuit pattern on the photomask has been transferred includes a first region within a critical radius from a center of the wafer and a second region outside the critical radius; measuring overlays representing an interlayered misalignment of the plurality of shots; providing first augmented overlays to the first region of a first shot from among the plurality of shots, based on overlays included in the first region of the first shot; providing second augmented overlays to the second region of the first shot, based on overlays included in the plurality of shots; and calculating an overlay model representing an overlay of an arbitrary location on the entire surface of the first shot by regression-analysis on the first and second augmented overlays.

According to another aspect of the inventive concept, there is provided a method of manufacturing a semiconductor device, the method including transferring a circuit pattern on a photomask to each of a plurality of first wafers included in a first lot, wherein each of a plurality of shots to which the circuit pattern on the photomask has been transferred includes a first region within a critical radius from a center of the wafer and a second region outside the critical radius; obtaining an overlay of the plurality of first wafers to which the circuit pattern on the photomask has been transferred; analyzing the overlay of the first wafers; and performing a lithography process on second wafers included in a second lot, based on the analyzing of the overlay of the first wafers of the first lot. The analyzing of the overlay of the first wafers of the first lot includes providing first augmented overlays to the first region of a first shot from among the plurality of shots, based on overlays included in the first region of the first shot; processing the overlays of the second region such that the overlays of the second region extend in a radial direction; providing second augmented overlays to the second region of the first shot, based on the processed overlays of the second region; and performing regression analysis on the first and second augmented overlays.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
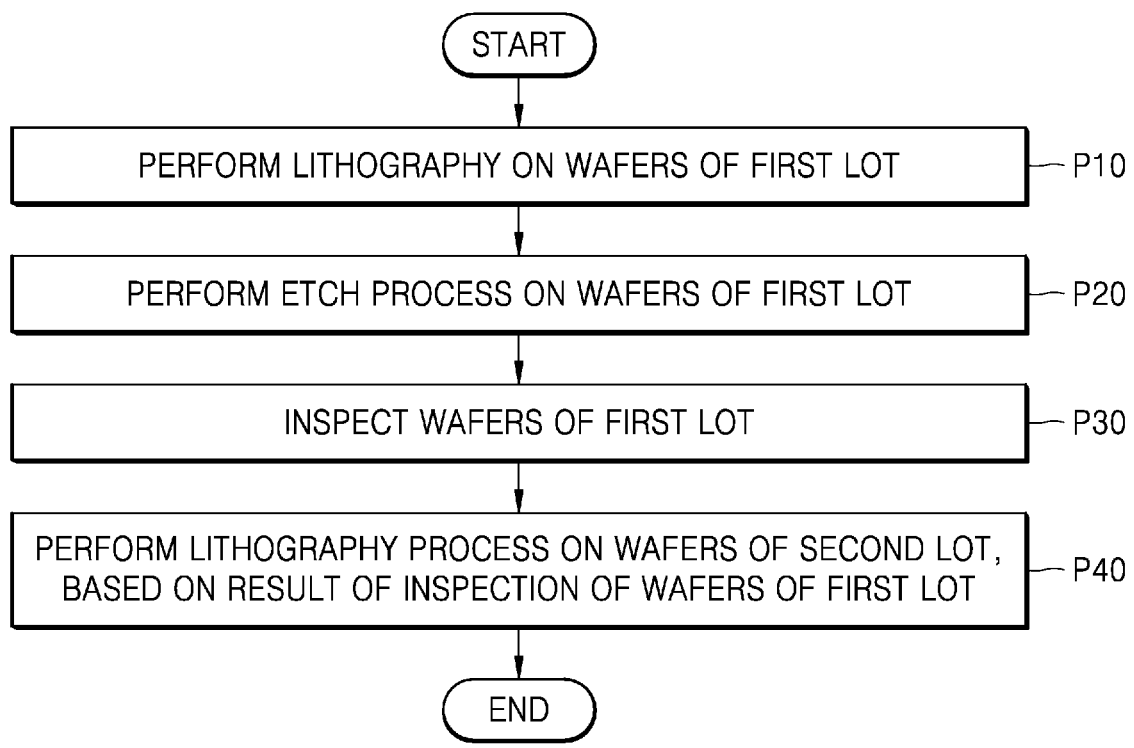
FIG. 1 is a flowchart of a method of manufacturing a semiconductor device, according to example embodiments.

Embodiments will now be described more fully with reference to the accompanying drawings. In the accompanying drawings, like reference numerals may refer to like elements, and repeated descriptions of the like elements will be omitted.

FIG. 1 is a flowchart of a method of manufacturing a semiconductor device, according to example embodiments.

Figure 2:
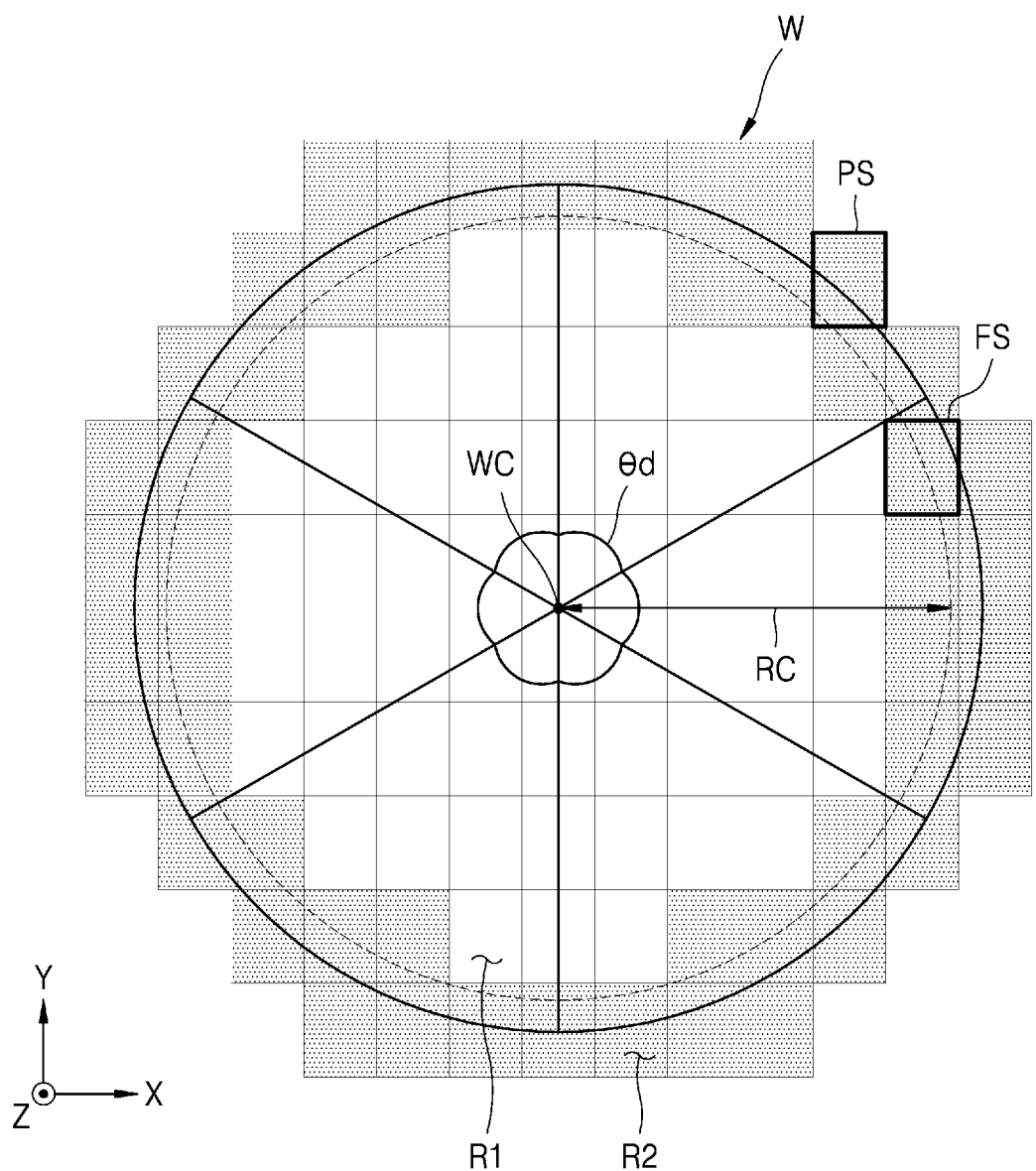
FIG. 2 is a plan view of a full shot and a partial shot within a wafer.
Figure 3A:
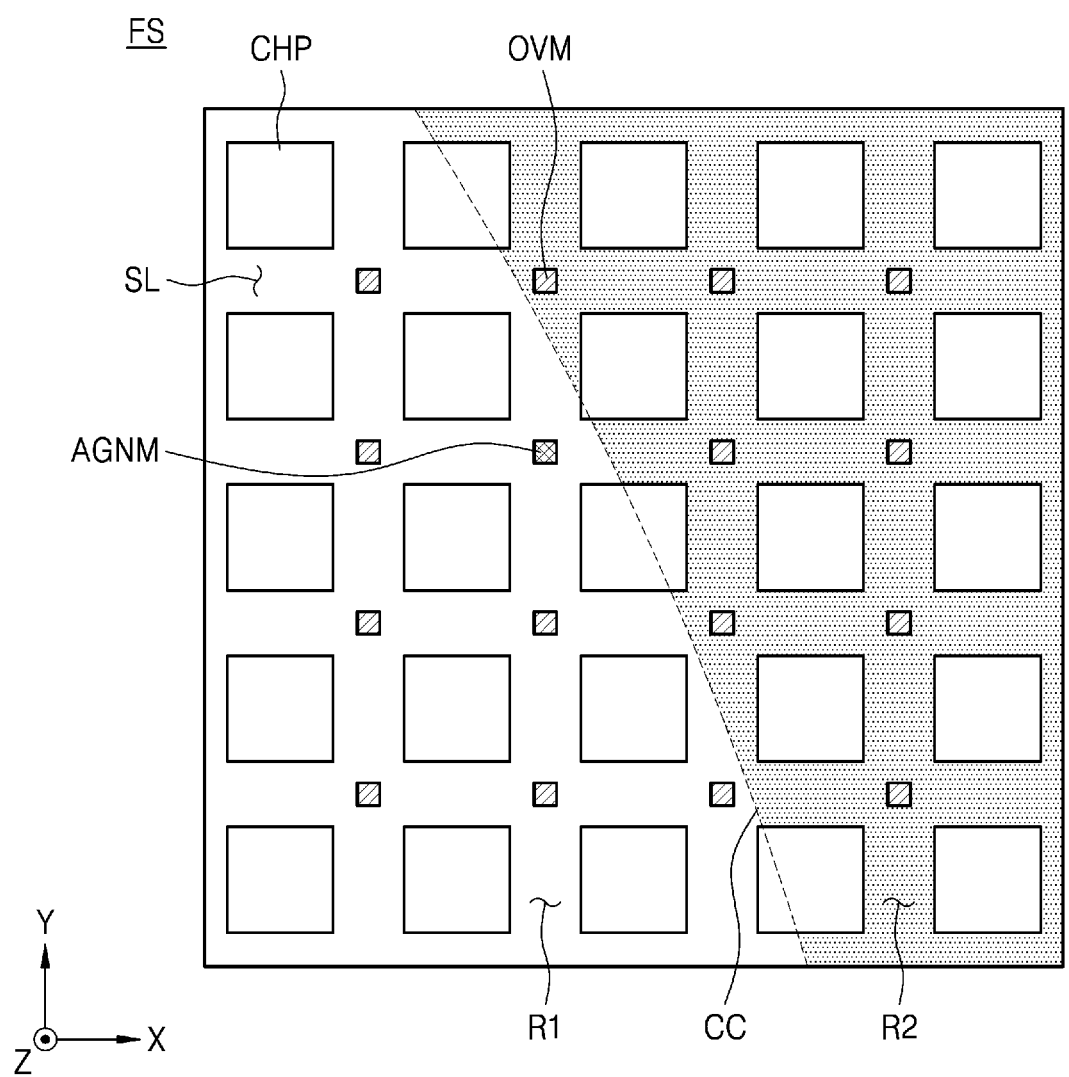
FIGS. 3A and 3B are magnified partial plan views of a full shot and a partial shot of FIG. 2.
Figure 3B:
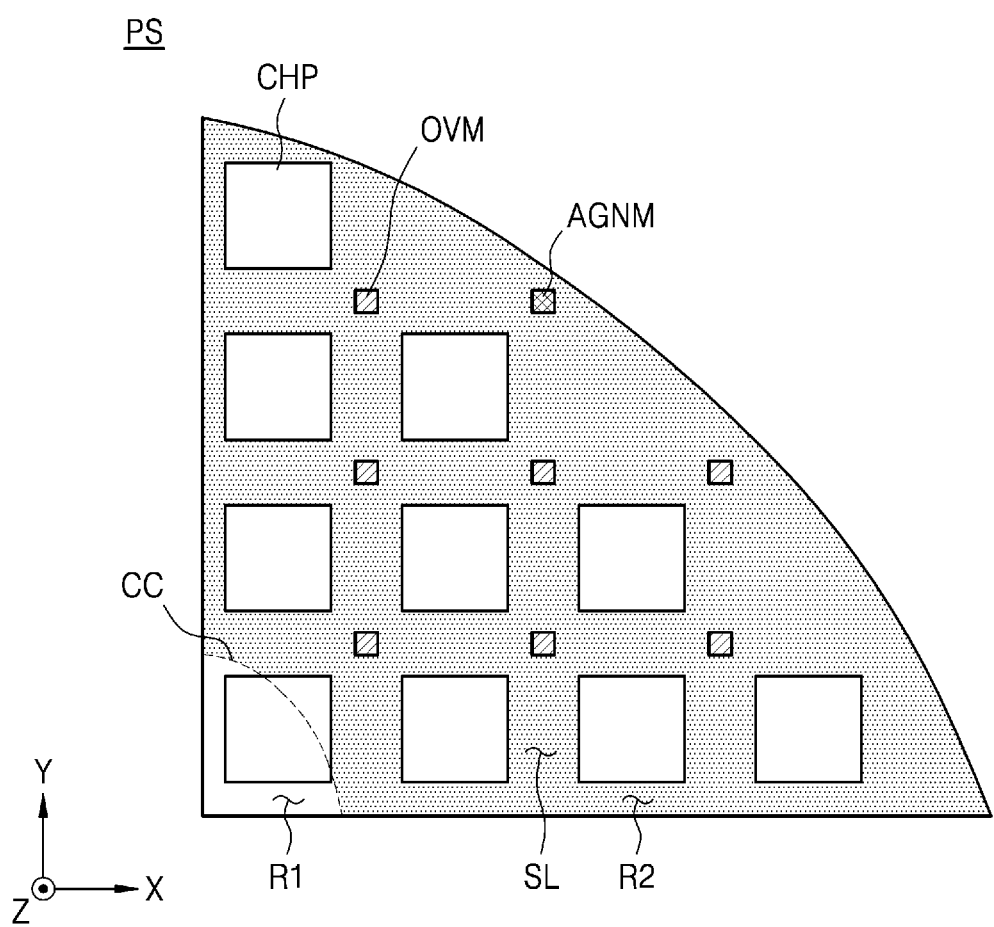

FIG. 2 is a plan view for explaining a method of manufacturing a semiconductor device, according to example embodiments. FIG. 3A is a magnified partial plan view of one of full shots FS of FIG. 2, and FIG. 3B is a magnified partial plan view of one of partial shots PS of FIG. 2. The full shot FS of FIG. 3A and the partial shot PS of FIG. 3B are each outlined in bold in FIG. 2.

Referring to FIGS. 1 and 2, in P10, a lithography may be performed on wafers W of a first lot.

The lithography may include processes such as adhesion promotion, spin coating, soft bake, exposure, post-exposure bake, development, after-development inspection, and hard bake.

A photoresist material may lack adhesion to the surface of silicon or a silicon-containing material. In the adhesion promotion, photoresist is attached to a wafer W or circuit patterns formed on the wafer W. Accordingly, before the photoresist material is provided onto the wafer W, the adhesion promotion may be performed on the surface of the wafer W. A representative example of the adhesion promotion is processing the surface of the wafer W with hexamethyldisilazane (HMDS). Because HMDS is able to make the surface of the wafers W hydrophobic, HMDS may improve adhesion between the photoresist material and the wafer W.

Then, the spin coating may be performed. In the spin coating, a photoresist material layer is provided on the wafer W. The photoresist material may be formed from organic polymer provided in a solution-state. To coat the wafer W with the photoresist material, the wafer W provided with a solution-state photoresist may be spin-rotated at a high speed. As an excess resist is taken out by the spin rotation of the wafer W and a solvent evaporates, a thin solid photoresist layer may be provided.

A material used to form the photoresist layer may be sensitive to ultraviolet (UV) light, deep UV (DUV) light, extreme UV (EUV) light, excimer laser beams, X rays, or electrons. In an EUV exposure process, the number of photons during exposure is less than that in an exposure process such as DUV, and thus, a material having a high EUV absorption rate is used. Thus, a photoresist material for EUV may include, for example, hydroxy styrene, which is a polymer. Iodophenol may be provided as additives to EUV photoresist.

According to some embodiments, a thickness of the photoresist layer may range from about 0.1 μm to about 2 μm. According to some embodiments, the thickness of the photoresist layer may range from about 200 nm to about 600 nm. The EUV photoresist may be provided with a small thickness by spin-coating a dilute photoresist solution.

In some cases, the EUV photoresist may include an inorganic material such as tin oxide. In this case, even when the EUV photoresist is removed through a strip process after the lithography process and subsequent processes are finished, the inorganic material may remain in an underlying layer of the photoresist at a concentration of about $1*10^{11}/cm^3$. When an inorganic material is used as photoresist, it is easy to reduce the thickness of the photoresist, and etch selectivity is high, and thus, a hard mask disposed under the photoresist may be implemented to be thin.

When a layer to be etched has a large thickness, a hard mask layer including amorphous carbon may be further provided under the photoresist. According to some embodiments, the hard mask layer may further include fluorine. When the hard mask layer includes fluorine, EUV sensitivity of the photoresist may be improved. An anti-reflection layer may be further provided between the hard mask layer and the photoresist.

According to some embodiments, a soft bake process may be selectively performed after the spin coating process. In some cases, the density of the photoresist material layer coated on the wafer W may be insufficient to conduct a subsequent process. The soft bake process may densify the photoresist material layer and remove solvent that remains on the photoresist material layer. The soft bake process may be performed by a bake plate included in a lithographic apparatus. The wafer W, on which the soft bake process has been performed, may be selectively cooled by a chill plate.

Thereafter, referring to FIGS. 1 through 3B, an exposure process may be performed. In the exposure process, a pattern previously formed on a patterning device such as a lithographic mask is transferred to the wafer W. In the exposure process, a radiation beam having a cross-section set by the patterning device may be radiated onto the wafer W.

The radiation beam may include UV rays, DUV rays, EUV rays, an excimer laser beam, X rays, electron rays, and the like. According to embodiments, a wavelength of EUV rays may range from about 4 nm to about 124 nm. According to embodiments, the wavelength of EUV rays may range from about 5 nm to about 20 nm. According to embodiments, the wavelength of EUV rays may range from about 13 nm to about 14 nm. According to embodiments, the wavelength of EUV rays may be about 13.5 nm.

A radiation system for generating EUV rays may include a laser to excite a plasma source to provide plasma, and a source collector module to store the plasma. For example, plasma may be generated by radiating a laser beam to a plasma source such as tin particles and Xe gas or Li vapor. Such a radiation system is generally referred to as a laser-produced plasma (LPP) source. Alternative sources include a discharge plasma source or a source based on synchrotron radiation provided by an electron storage ring.

According to some embodiments, the patterning device may be of transmissive or reflective type. The patterning device may be one of, for example, a mask, a programmable mirror array, and programmable LCD panels. When the patterning device is of a mask type, the patterning device may be a binary type, an alternating phase-shift type, and an attenuated phase-shift type, or any one of various hybrid types, but embodiments are not limited thereto.

When the patterning device is a programmable mirror array, the patterning device may include, for example, a set of small mirrors arranged in a matrix form. The small mirrors included in the patterning device may be individually tilted to reflect radiation beams incident on the small mirrors in different directions, respectively. The tilted small mirrors may form patterns in radiation beams reflected by the mirror matrix, respectively.

An EUV photomask, which is an example of the patterning device, may include a silicon substrate, and a plurality of silicon layers and molybdenum layers alternately arranged on the silicon substrate. A ruthenium (Ru)-containing layer may be further provided on the plurality of silicon layers and molybdenum layers alternately stacked. A layout pattern composed of a tantalum boron nitride (TaBN)-containing layer and a Lawrencium-containing layer may be formed on the Ru-containing layer. The various materials and layers disclosed herein for the EUV photomask are for illustrative purposes only and do not limit the technical spirit of the inventive concept in any sense.

In the exposure process, the properties of a photoresist material layer are partially changed to provide a photoresist pattern for forming a semiconductor circuit. Photoresist is a material that causes a photochemical reaction to light exposure. The photoresist material layer may be partially exposed by a patterning device such as a photomask. By projecting light transmitted by the patterning device onto the photoresist material layer, a circuit pattern of one layer that constitutes a semiconductor device may be transferred to the photoresist material layer on the wafer W.

The exposure process may be performed based on measurement of an alignment mark AGNM formed on the wafer W. By identifying the location of the alignment mark AGNM before exposure, a difference between the location of an alignment mark AGNM designed to form an underlying layer and the location of an alignment mark AGNM actually implemented in the underlying layer may be determined. By identifying the location of the alignment mark AGNM from a plurality of locations on the wafer W and then performing regression analysis on the identified location, a model function representing a difference between a designed location and an actual location may be determined for an arbitrary element on the wafer W.

According to embodiments, locations of alignment marks AGNM may be identified by a plurality of light beams having different wavelengths. For example, when the locations of the alignment marks AGNM are identified by light beams of four different wavelengths, four model functions corresponding to the light beams of four different wavelengths may be provided, and the exposure process may be performed based on a combined model function generated based on a weighted sum of the four model functions.

Because a semiconductor device is manufactured by using a series of patterning processes with respect to a plurality of vertically stacked material layers, alignment of a new layer with respect to a previously-formed circuit pattern is a key factor in increasing the yield of semiconductor device manufacturing.

An EUV exposure process may be performed by axial projection (e.g., about 4:1 axial projection). Because a mask pattern is reduced to a size of about ¼ and transferred to the wafer W, a full shot may eventually correspond to a size of about ¼ of the entire mask pattern. Here, ¼ is a reduction ratio of the length, and may correspond to a reduction of about ¹⁄₁₆ in terms of area. Accordingly, a pattern formed on the EUV photomask has a larger critical dimension than a pattern actually transferred to the wafer W, and thus, the accuracy of the pattern may be improved, and accordingly, the reliability of a lithography process using the EUV photomask may be improved.

Here, exposure methods may be classified into a scanning method for continuously photographing and a step method for photographing step by step. Because the EUV exposure process is generally performed by a scanning method, an EUV exposure apparatus is generally referred to as a scanner. Further, the EUV exposure apparatus may perform scanning by using a slit that restricts light to a partial area of a mask. The slit may be an optical element that restricts light in an apparatus for performing an EUV exposure process so that the light is uniformly radiated to an EUV mask. The light is limited to be radiated to a partial area of the mask through the slit, but the light may be continuously radiated while moving the mask in a direction opposite to a scanning direction. A region on the test wafer W, onto which light is radiated through scanning over the entire area of the mask as described above, may be a full shot FS.

According to some embodiments, a space on the wafer W may be filled with a liquid having a high refractive index, such as water. Accordingly, at least a portion of the wafer W may be covered with the liquid. The liquid is referred to as an immersion liquid, and the wafer W being immersed may refer to not only the wafer W being immersed in the liquid but also the immersion liquid being placed on the path of a radiation beam for performing exposure.

Two directions parallel to an upper surface of the wafer W and substantially perpendicular to each other are referred to as an X direction and a Y direction. A direction substantially perpendicular to the upper surface of the wafer W is referred to as a Z direction. The X direction and the Y direction may be directions distinguished from each other. In more detail, the Y direction may be a direction in which scanning is performed during scanning-type exposure. The X direction may be a direction substantially perpendicular to the direction in which the scanning proceeds, and this description is equally applied to all the drawings below.

The full shot FS is a region on the wafer W to which the entirety of a pattern formed on a patterning device such as a lithography mask is transferred. A plurality of chip regions CHP may be defined within one full shot FS. The plurality of chip regions CHP may be regions in which a plurality of circuit layouts for forming a semiconductor device are overlapped with each other and accordingly, a semiconductor chip is formed. According to some embodiments, the full shot FS may have, but is not limited to, a size of about 26 mm on the x axis and about 33 mm on the y axis. One full shot FS may include various numbers and sizes of chip regions CHP according to the type and specification of a device to be formed.

The partial shot PS is a region on the wafer W to which a portion of the pattern formed on the patterning device such as a lithography mask is transferred, because shots located in an outer portion of the wafer W do not form full shots due to the circular shape of the wafer W. Accordingly, when an exposure process is performed on the outer portion of the wafer W, only a portion of the mask pattern may be transferred to the wafer W.

Each of the full shots FS and the partial shots PS may include chip regions CHP and scribe lines SL of the chip regions CHP. The scribe lines SL may extend between the chip regions CHP and may separate the chip regions CHP from one another horizontally (i.e., any one of the X direction and the Y direction). The scribe lines SL may be a region for separating a semiconductor chip formed on the chip regions CHP into individual devices via a sawing process.

Although FIGS. 3A and 3B illustrate that each of the chip regions CHP has an approximately square profile, embodiments of the inventive concept are not limited thereto. For example, chips may be driver driving IC chips. In this case, a pair of opposite sides of the chips may be longer than another pair of opposite sides of the chips perpendicular to the former pair of opposite sides. For example, the chips may have a rectangular profile.

According to some embodiments, a memory device may be formed within the chip regions CHP. According to some embodiments, a non-volatile memory device may be formed within the chip regions CHP. According to some embodiments, the non-volatile memory device may be a non-volatile NAND-type flash memory. According to some embodiments, the non-volatile memory device may be PRAM, MRAM, ReRAM, FRAM, or NOR flash memory. A volatile memory device in which data is lost when power is cut off, such as DRAM or SRAM, may be formed within the chip regions CHP. According to some embodiments, for example, a logic chip or any one of a measuring device, a communication device, a digital signal processor (DSP), or a system-on-chip (SoC) may be formed within the chip regions CHP.

An alignment mark AGNM and overlay marks OVM may be further formed on the scribe lines SL of the full shots FS and the partial shots PS. According to some embodiments, the alignment mark AGNM and the overlay marks OVM are formed on only the scribe lines SL. However, embodiments of the inventive concept are not limited thereto. For example, some of the alignment mark AGNM and the overlay marks OVM may be formed within the chip regions CHP.

According to some embodiments, the alignment mark AGNM may be a pattern used to accurately set an exposure region of lithography. According to some embodiments, the alignment mark AGNM may be arranged adjacent to a center portion of the full shot FS. However, embodiments of the inventive concept are not limited thereto. Each of a full shot FS and a partial shot PS is illustrated as including one alignment mark AGNM, but embodiments are not limited thereto. For example, some of the full shots FS and the partial shots PS may include two or more alignment marks AGNM. Some of the full shots FS and the partial shots PS may include no alignment marks AGNM.

According to some embodiments, the overlay marks OVM may be patterns for measuring an overlay. According to some embodiments, the overlay marks OVM may be arranged with a higher density than the alignment mark AGNM. Marks having various functions may be further formed on the scribe lines SL of the full shots FS and the partial shots PS. For example, a mark for electrically testing the characteristics of a completed semiconductor device, a mark for measuring the thickness of an uppermost layer after chemical mechanical polishing (CMP) is performed, and a mark for optically measuring a critical linewidth or an internal thickness may be further provided to the full shot FS.

The overlay marks OVM and the alignment mark AGNM may have a box in box structure or a grating structure. The overlay marks OVM and the alignment mark AGNM in a box in box structure may need an exclusive region where other overlay marks OVM and other alignment marks AGNM are not formed so that proper overlay measurement is performed. Overlay marks OVM having a grating shape need no exclusive regions, and may be provided with a higher density than overlay marks OVM having a box in box shape. Accordingly, the overlay marks OVM having a grating shape may provide more information than the overlay marks OVM of a box in box shape, through overlay measurement.

After the exposure process, a bake process may be selectively performed before a development process. The bake process after exposure may be performed by a bake plate. The bake process after exposure is a selective baking process used to induce uniformity improvement of a photoresist layer through an additional chemical reaction or diffusion of a specific component within the photoresist layer.

Then, via the development process, a photoresist pattern may be formed on the wafer W. The photoresist pattern may be formed by a developer. An exposed portion of the photoresist material layer may change to be soluble (for positive photoresist) or to be insoluble (for negative photoresist). In the developing process, an exposed and soluble portion of the photoresist material layer (in the case of a positive photoresist) or a portion that has not been exposed and remains soluble (in the case of a negative photoresist) is removed.

Then, referring back to FIG. 1, in P20, an etch process may be performed on the wafers W of the first lot. The etching process may be a dry or wet etch process. The dry etch process may be, for example, reactive ion etching (ME), deep ME (DRIE), ion beam etching (IBE), or Ar milling. As another example, a dry etch process capable of being performed on the wafer W may be atomic layer etching (ALE). A wet etch process capable of being performed on the wafer W may be an etch process that uses at least one of $Cl_2$, HCl, $CHF_3$, $CH_2F_2$, $CH_3F$, $H_2$, $BCL_3$, $SiCl_4$, $Br_2$, HBr, $NF_3$, $CF_4$, $C_2F_6$, $C_4F_8$, $SF_6$, $O_2$, $SO_2$, and COS as an etchant gas.

Then, in P30, the wafers W of the first lot may be inspected. The inspection of the wafer W may include inspection of pattern characteristics including: i) accuracy of the size, shape and profile of features included in a pattern newly formed by the etching process; ii) measurement and calculation of an overlay indicating consistency (or misalignment) between a preceding layer and the pattern newly formed by the etching process; and/or iii) presence or absence of defects in the pattern formed by the etching process. According to embodiments, the wafer W may be inspected by a scattering optical system. However, embodiments are not limited thereto, and the wafer W may be inspected by an image based optical system.

According to embodiments, structural characteristics of the overlay marks OVM may be calculated by measuring light diffracted by the overlay marks OVM. The structural characteristics of the overlay marks OVM may be calculated through wave analysis, nonlinear regression, and/or comparison with a library of simulated spectra. Because a general shape (i.e., a designed shape) of the profiles of the overlay marks OVM is known and some parameters for a structural change may be derived from the manufacturing process, the structural properties of the overlay marks OVM may be calculated using parameters derived from scattering spectral data. The structural properties of the overlay marks OVM may include an overlay indicating accuracy (or misalignment) between the preceding layer and the pattern newly formed by the etching process.

According to embodiments, the overlay may be further measured from the pattern within the chip regions CHP. In more detail, patterns for constituting the semiconductor devices formed within the chip regions CHP may be formed by the etch process of P20. An overlay value within the chip regions CHP may be obtained by measuring misalignment between the pattern newly formed within the chip regions CHP in P20 and a pattern overlapped with the newly formed pattern.

The inspection of the wafer W in P30 will now be described in more detail with reference to FIG. 4.

Figure 4:
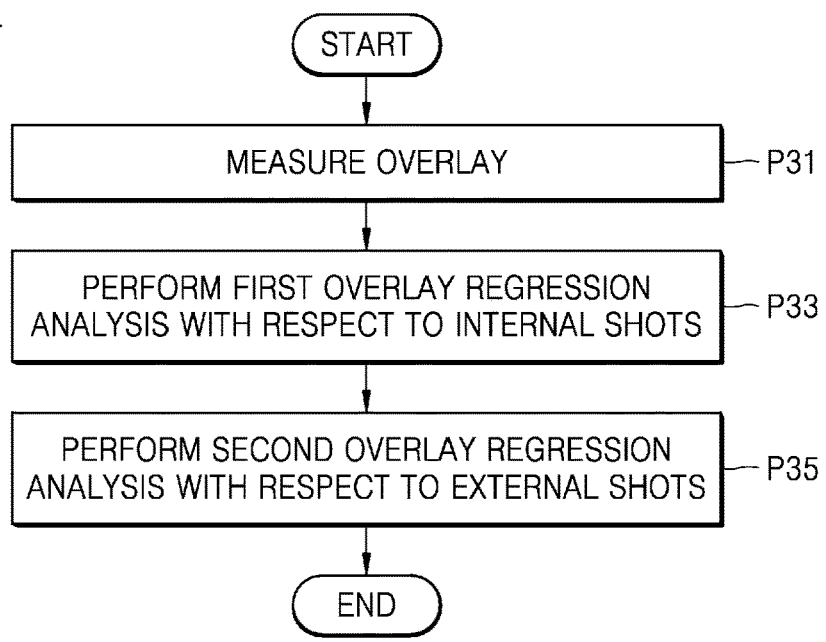
FIGS. 4 and 5 are flowcharts for explaining a wafer inspection included in a method of manufacturing a semiconductor memory device, according to example embodiments.

FIG. 4 is a flowchart of obtainment of an overlay model, according to some embodiments.

Referring to FIGS. 2 through 4, the inspection (P30) of the wafer W may include measuring an overlay (P31), performing a first overlay regression analysis with respect to internal shots (P33), and performing a second overlay regression analysis with respect to external shots (P35).

Based on a critical circle CC defined by a critical radius RC within the wafer W, a first region R1 having low radial dependency and a second region R2 having high radial dependency may be defined. In more detail, a portion of the wafer W within the critical circle CC is defined as the first region R1, and a portion of the wafer W outside the critical circle CC is defined as the second region R2. The critical radius RC may extend from a wafer center WC to the circumference of the critical circle CC.

The radial dependency of a specific portion of the overlay being large refers to that the size of the specific portion of the overlay mainly depends on a linear distance from the wafer center WC of the wafer W and the direction of the overlay is substantially parallel to a radial direction.

Some of the full shots FS may be arranged within the first region R1. Each of the full shots FS within the first region R1 is referred to as an internal shot. The partial shots PS and some of the full shots FS extend over the first region R1 and the second region R2. Accordingly, the partial shots PS and some of the full shots FS may include the first region R1 and the second region R2. The full shots FS and the partial shots PS including the first region R1 and the second region R2 will now be referred to as external shots. The external shots are displayed as dot patterns in FIGS. 3A and 3B so as to be distinguished from the internal shots.

In FIGS. 3A and 3B, the wafer W has a radius of 150 mm and a critical radius RC of 138.5 mm, 56 internal shots are included, and 50 external shots are included. However, this is merely an example and the technical spirit of the inventive concept is not limited thereto. The critical radius RC may be set differently according to the size of the wafer W and process characteristics, and thus, the numbers of internal shots and external shots may also vary.

Referring to FIGS. 2 through 4, in P33, the first overlay regression analysis may be performed on the internal shots. The overlay marks OVM may be arranged at a finite number of discrete locations on the wafer W as shown in FIGS. 3A and 3B. According to some embodiments, consecutive overlay values for the entire surface of the wafer W may be obtained by applying a well-known fitting technique to overlay information measured from the overlay marks OVM. According to some embodiments, the first overlay regression analysis may include regression-analyzing overlays in the X direction and the Y direction respectively measured from the overlay marks OVM by using an orthogonal polynomial as a basis.

An overlay model dx in the X direction and an overlay model dy in the Y direction of the internal shots calculated by the first overlay regression analysis may be expressed as in Equation 1.

$$dx = k1 + k3 \cdot x + k5 \cdot y + k7x^2 + k9xy + k11y^2 +$$

$$dy = k2 + k4 \cdot x + k6 \cdot y + k8x^2 + k10y^2 + k12y^2 +$$ [Equation 1]

where x indicates a location coordinate on the wafer W in the X direction, and y indicates a location coordinate on the wafer W in the Y direction. In Equation 1, k1 through k12 indicate correction parameters that are determined by the first regression analysis. For example, k1 and k2 indicate parameters for correcting a parallel movement error, k3 and k6 indicate parameters for correcting a scaling error, and k4 and k5 indicate parameters for correcting a rotation error.

In Equation 1, the overlay models have been described based on a polynomial. However, this is merely an example, and the technical spirit of the inventive concept is not limited thereto. The overlay models may be based on a complete basis set of a function space including a discontinuous Chebyshev polynomial, a Zernike polynomial, and a discrete orthogonal polynomial. The complete basis set refers to a set of bases including a minimum number of bases that may represent an arbitrary function on the function space.

In Equation 1, parameters of a polynomial less than or equal to a second power are specified. However, depending on the objective of overlay modeling and correction through the overlay modeling, the overlay models may include parameters of a third or higher order polynomial. For example, the overlay models may include parameters of a seventh order polynomial. During an overlay regression analysis, the terms of higher order than a correction range are referred to as residuals. For example, when a range of calculation and correction of overlay parameters is performed by a seventh order polynomial, terms of eighth order or greater may be residuals of the overlay regression analysis.

According to some embodiments, parameters including the correction parameters k1 through k12 may be determined by a least square method. According to some embodiments, the first overlay regression analysis may include determining the parameters including the correction parameters k1 through k12 in order to minimize a deviation between the values of overlays measured by the overlay marks OVM and the values of the overlay models according to Equation 1. In more detail, the first overlay regression analysis may include determining the parameters including the correction parameters k1 through k12 in order to minimize each of the formulas included in Equation 2 below.

$$\sum_i (dx_i - dx(i))^2$$ [Equation 2]

$$\sum_i (dy_i - dy(i))^2$$

where $dx_i$ and $dy_i$ indicate overlay values of an i-th overlay mark OVM on a wafer in the X direction and the Y direction, respectively. In Equation 2, i indicates an ordinal number for identifying different overlay marks on the wafer. In Equation 2, dx(i) and dy(i) are values of overlay models that are calculated for location coordinates of the i-th overlay mark OVM, respectively.

Then, in P35, the second overlay regression analysis may be performed on the external shots.

The execution of the second overlay regression analysis with respect to the external shots will now be described in more detail with reference to FIGS. 5 through 9.

Figure 5:
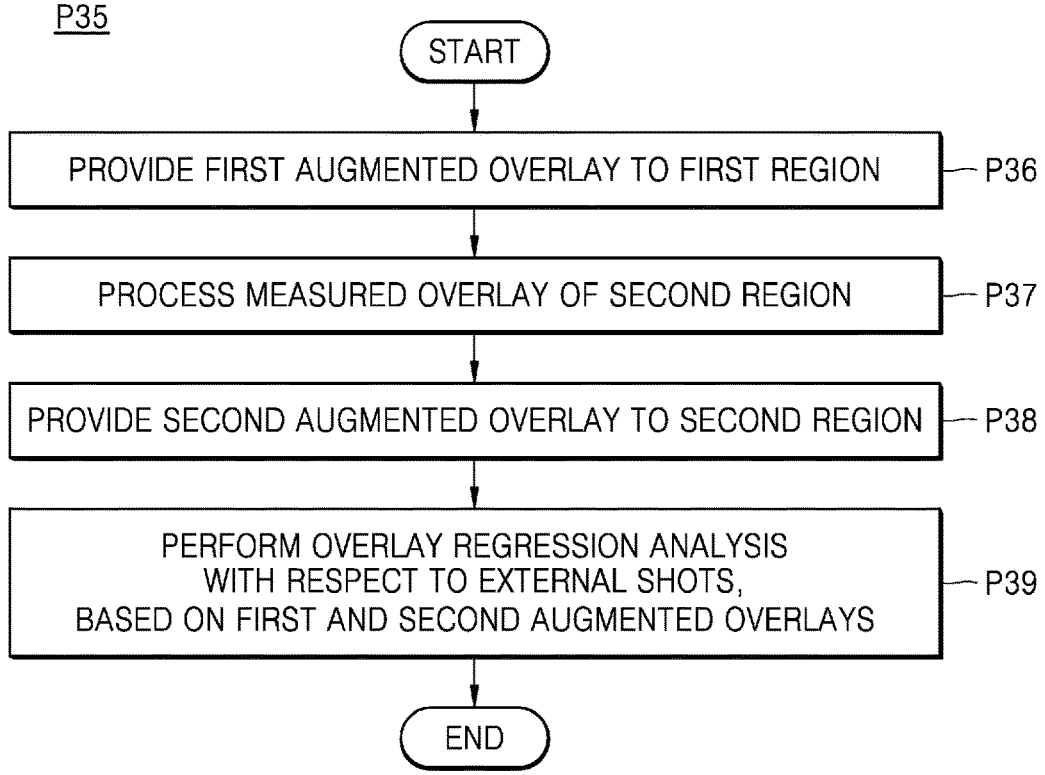

FIG. 5 is a flowchart of a second overlay regression analysis according to some embodiments.

Figure 6:
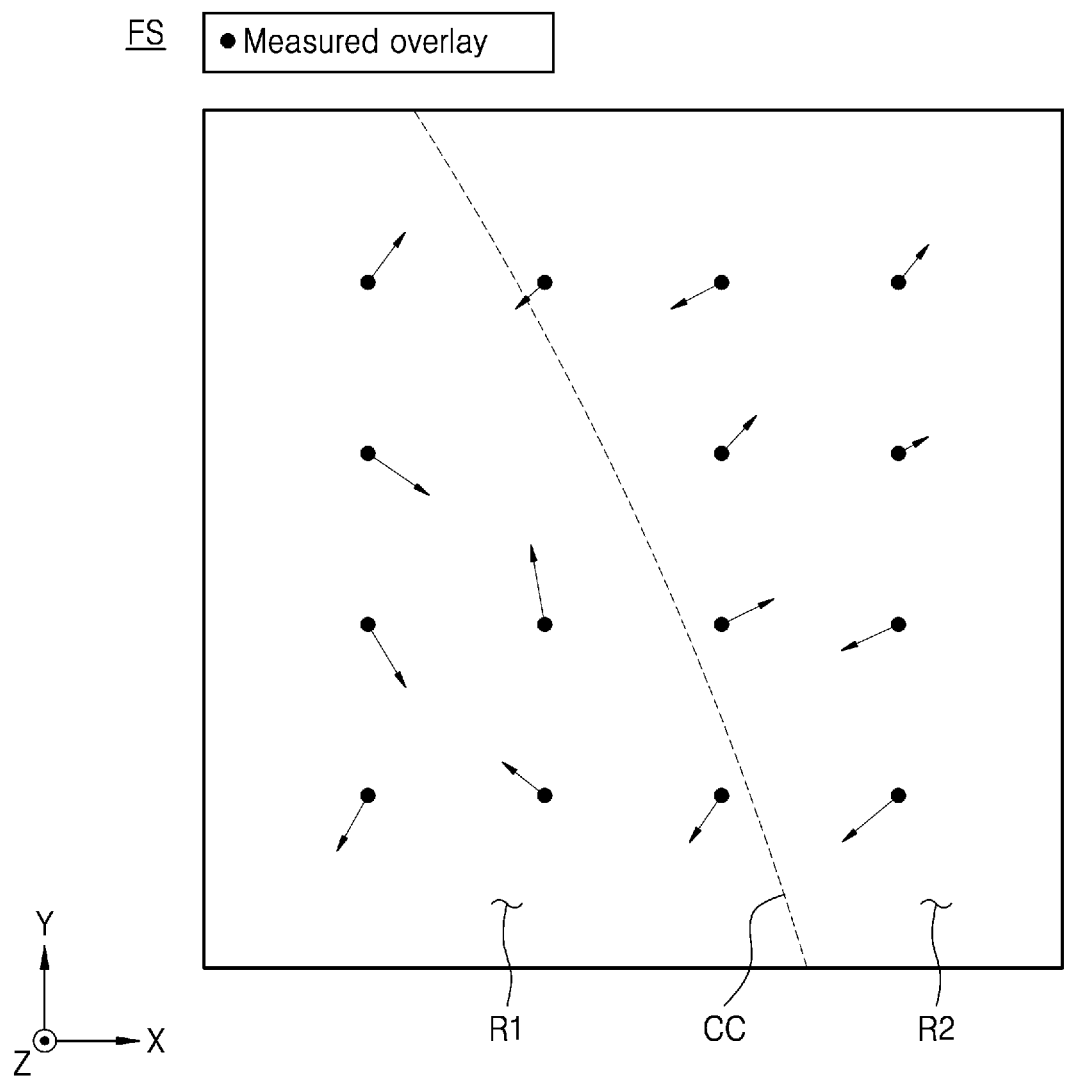
FIGS. 6 through 9 are plan views for explaining an inspection, according to example embodiments.
Figure 7:
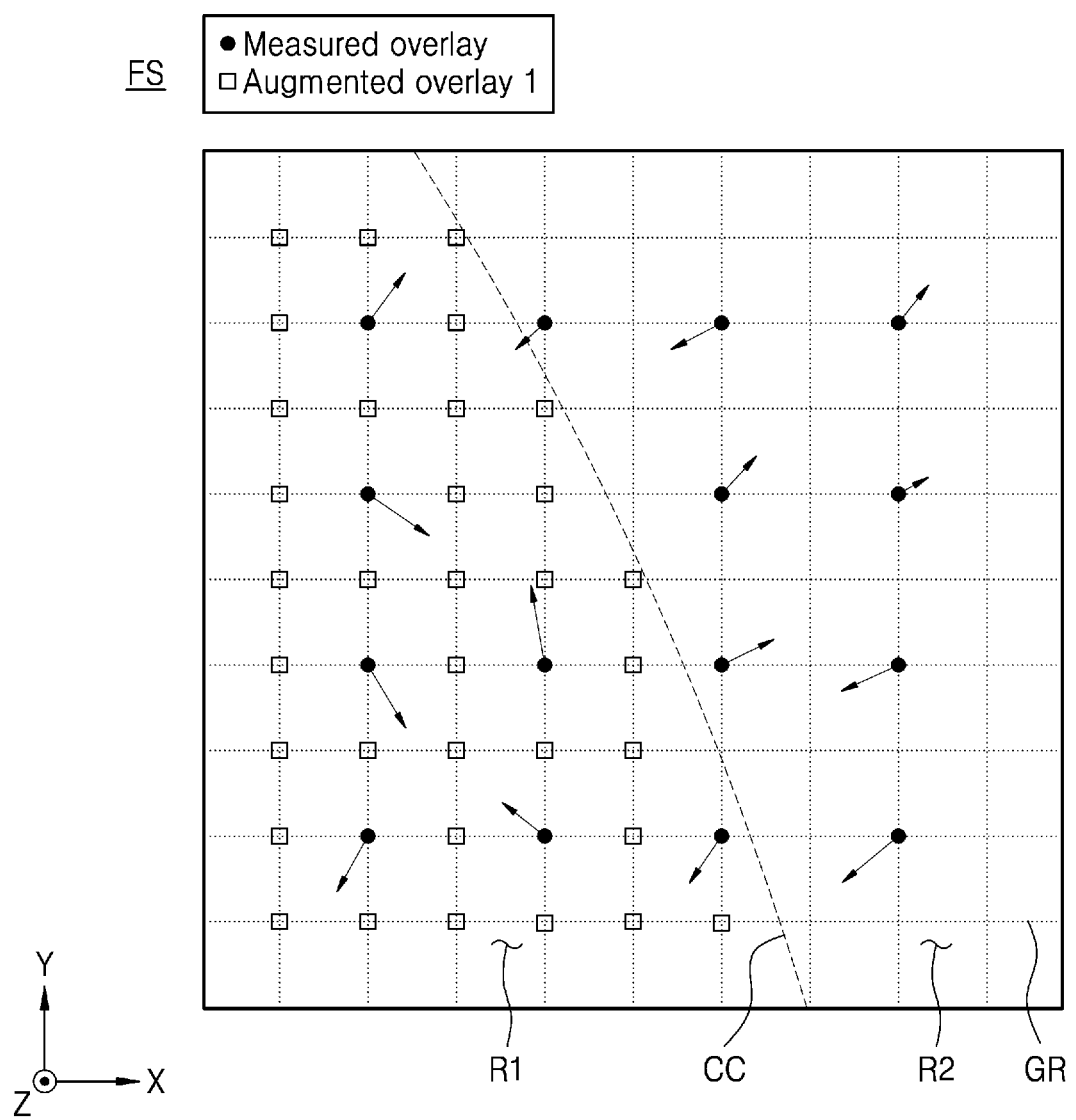
Figure 8:
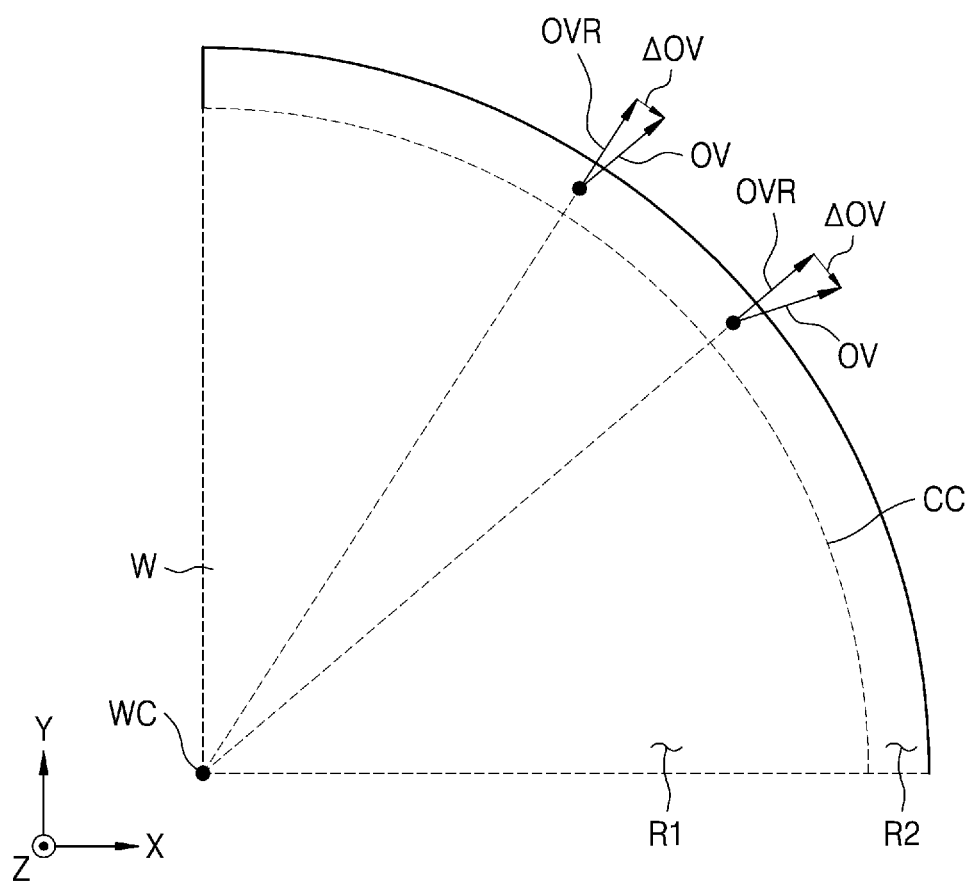
Figure 9:
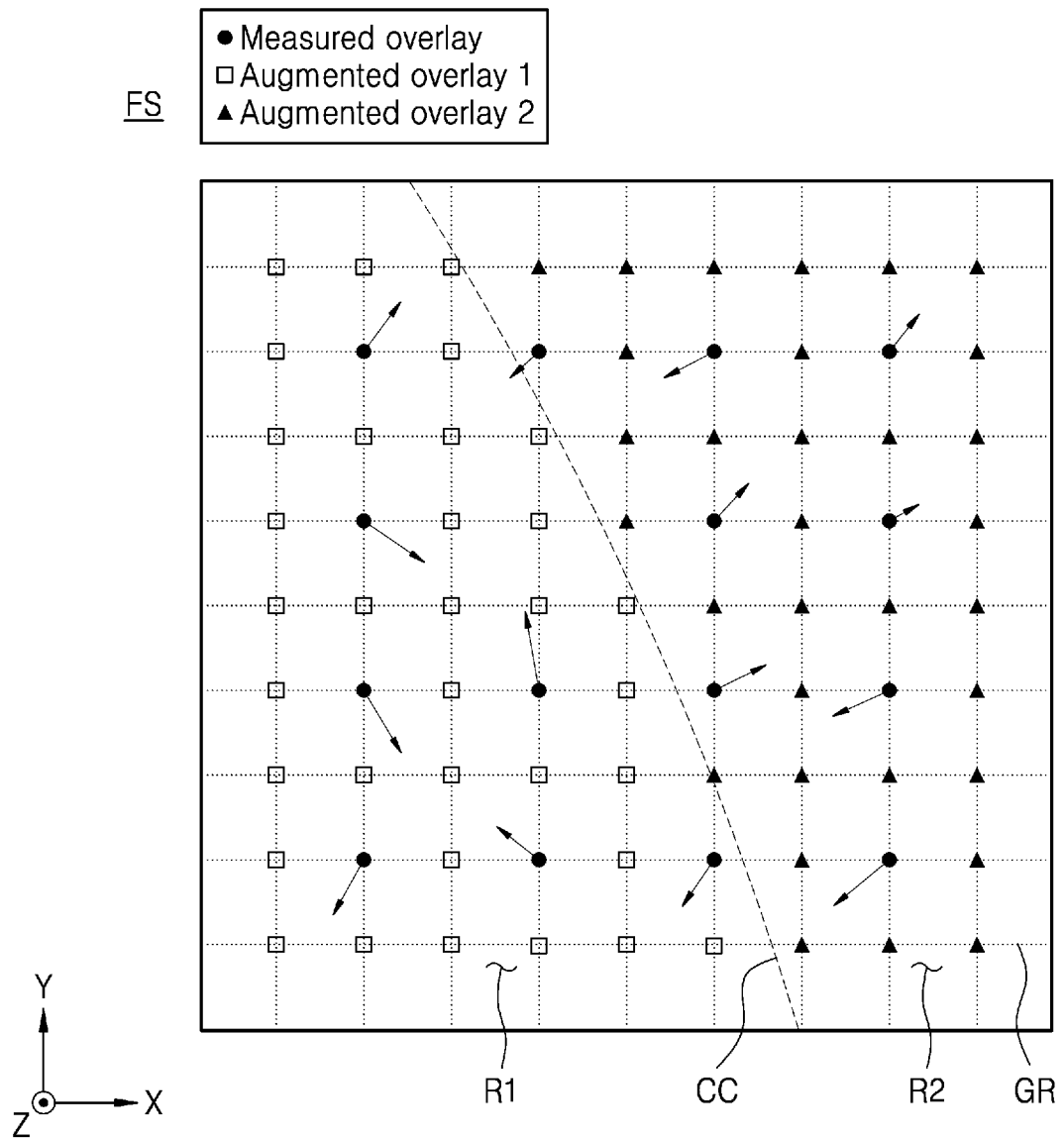

FIGS. 6 through 9 are views for explaining the second overlay regression analysis according to some embodiments. In more detail, FIGS. 6, 7, and 9 illustrate overlays measured from the overlay marks OVM and/or patterns formed within the chip regions CHP of FIG. 3A, and FIG. 8 illustrates a portion of the wafer W to illustrate overlay data transformation of P37.

In FIGS. 6, 7, and 9, illustration of the chip regions CHP, the overlay marks OVM, and the alignment mark AGNM is omitted, and arrows indicate sizes and directions of the measured overlays.

Referring to FIG. 5, the performing (P35) of the second overlay regression analysis with respect to the external shots may include providing a first augmented overlay to the first region R1 of the magnified partial plan view of the full shot FS illustrated in FIG. 3A (P36), processing a measured overlay of the second region R2 (P37), providing a second augmented overlay to the second region R2 (P38), and performing an overlay regression analysis with respect to the external shots, based on the first and second augmented overlays (P39).

Referring to FIGS. 5 through 7, in P36, the first augmented overlay may be provided to the first region R1. For example, the first augmented overlay may be provided to the first region R1 based on an orthogonal coordinate system using the X direction and the Y direction as an axis. In FIG. 7, the locations of augmented overlays are indicated by square points. Hereinafter, measurement-based overlays are referred to as measured overlays to be distinguished from augmented overlays in P36 and P38.

The first augmented overlays may be generated according to an arbitrary well-known fitting method based on the measured overlays on the first region R1. The overlays augmented to the first region R1 may be generated through a similar method to the overlay regression analysis describing only the measured overlays included in the first region R1 of each of the full shots FS through Equations 1 and 2. According to embodiments, the first augmented overlays may be aligned in the X direction and the Y direction so as to constitute at least some of the rows and columns of a certain grid GR. According to embodiments, at least some of the first augmented overlays may extend in a direction intersecting with the radial direction.

Then, referring to FIGS. 5 and 8, in P37, the measured overlay of the second region R2 may be processed. For example, the overlays of the second region R2 may be processed such that the overlays are parallel to the radial direction.

The processing of the measured overlay may include extracting a radial overlay OVR from each overlay OV. A component perpendicular to the radial direction for each overlay OV may be processed as an overlay error ΔOV.

Processing of overlay data of the second region R2 may include replacing the overlays OV of the second region R2 measured with an orthogonal coordinate system with the radial overlays OVR.

Then, referring to FIGS. 2, 5, and 9, in P38, a second augmented overlay may be provided to the second region R2. For example, second augmented overlays that are overlays in a radial direction from the wafer center WC of the wafer W may be providing to the second region R2. The locations of second augmented overlays are indicated as triangular points in FIG. 9. The first and second augmented overlays and the measured overlays may be both aligned in the X direction and the Y direction to form the rows and the columns of the grid GR.

The overlays augmented to the second region R2 may be generated by spline interpolation. The overlays augmented to the second region R2 may be generated by fitting the measured overlays of the second region R2 processed in P37 to radial positions from a center WC of the wafer W. The spline interpolation is a method of dividing the entire section by sub-sections to obtain a smooth function with a low-order polynomial. The spline interpolation provides an excellent approximation to the behavior of a function that changes rapidly and locally, and an interpolation result is limited to low-order polynomials. Thus, the spline interpolation provides high utility for subsequent lithography correction.

According to embodiments, the spline interpolation may be performed based on an angle. In more detail, the spline interpolation may be performed on transformed overlays on the second region R2 belonging to the range of a split angle θd of FIG. 2. For example, when the split angle θd is 60 degrees as shown in FIG. 2, the wafer W may be split into 6 portions, and spline interpolation may be performed on each of the 6 portions so that the overlay data within the second region R2 may be augmented.

However, embodiments are not limited thereto, and the wafer W may be equally split into 2 through 5 portions or 7 or more portions according to the size of the split angle θd, or may be split into portions having different split angles θd.

The measured overlays in the second region R2 largely depend on the location in the radial direction, but, in order for the overlay regression analysis to reflect this, the number of pieces of overlay data measured on the second region R2 is too small. In general, overlay correction is performed for each shot, and there are many cases where the number of pieces of overlay data on the second area R2 included in one shot is insufficient for regression analysis (e.g., less than three). Accordingly, an overlay regression analysis according to the related art does not reflect a radial tendency appearing around the wafer W.

According to embodiments, the second augmented overlays are provided by performing spline interpolation based on all of the measured overlays of a plurality of external shots including the second region R2 split according to the split angle θd, a sufficient number of overlay data may be provided to perform spline interpolation. Therefore the radial tendency of the measured overlays within the second region R2 may be accurately reflected. Furthermore, by separately adding an overlay for each portion of the wafer W divided by the division angle θd through spline interpolation, the tendency according to the angle of the overlay may be reflected.

Then, referring to FIGS. 5 and 9, in P39, an overlay regression analysis with respect to the external shots may be performed based on the first and second augmented overlays.

The overlay regression analysis with respect to the external shots based on the first and second augmented overlays is substantially the same as the overlay regression analysis described above with reference to Equations 1 and 2, and thus, overlay parameters of the external shot may be extracted.

Because the first and second augmented overlays form the rows and columns of the certain grid GR together with the measured overlays as described above, a regression analysis may be performed based on overlays uniformly distributed over the entire full shot FS, and the reliability of the overlay regression analysis may be improved.

In particular, the second augmented overlays in which the radial tendency has been reflected are provided to the second region R2 having large radial tendency as in P38, and at the same time, the first augmented overlays are provided to the first region R1 as in P36. This may prevent an excessive increase in the weight of an overlay within the second region R2 for each external shot, and thus, the reliability of the overlay regression analysis may be improved.

Referring back to FIG. 1, in P40, a lithography process may be performed on the wafers W of a second lot, based on a result of the inspection of the wafers W of the first lot. The execution of the lithography process of P40 is similar to the execution of the lithography process of P10 described above with reference to FIGS. 1 through 3B, but the lithography process of P40 may be performed based on the result of the inspection of P30.

In more detail, the lithography process with respect to the wafers W of the second lot may be adjusted based on the overlay regression analysis with respect to the first lot. The lithography process with respect to the wafers W of the second lot may be adjusted to reduce the overlay parameters calculated by the overlay regression analysis. According to some embodiments, adjustment factors of the lithography process with respect to the wafers W of the second lot may include, for example, a light intensity, a scan speed, a scan direction, an offset, rotation, and size adjustment.

According to embodiments, a lot-to-lot process control for controlling a process for a wafer W of a subsequent lot based on the inspection result of the wafers W included in a preceding lot has been described with reference to FIGS. 1 through 9. However, this description is equally applicable to a wafer-to-wafer process control. The wafer-to-wafer process control refers to controlling a process with respect to a subsequent wafer W included in a single lot, based on an inspection result of a preceding wafer W included in the same lot, or controlling a process on a wafer W included in another lot, based on an inspection result of a wafer W included in another lot.

Figure 10:
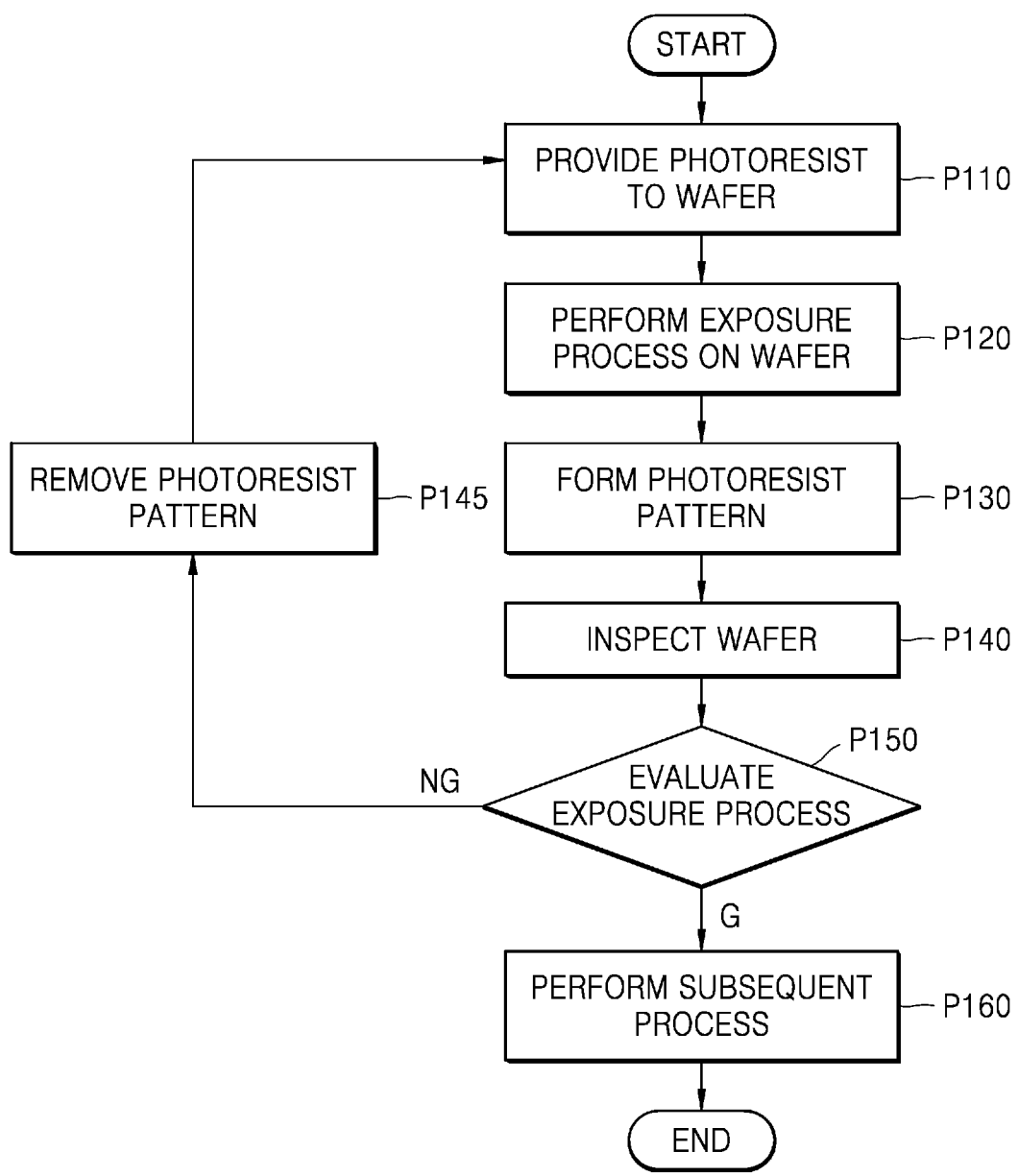
FIGS. 10 and 11 are flowcharts for explaining a method of manufacturing a semiconductor memory device, according to example embodiments.

FIG. 10 is a flowchart of a method of manufacturing a semiconductor device, according to other embodiments.

For convenience of explanation, a description of FIG. 10 that is the same as or similar to that given above with reference to FIGS. 1 through 9 will not be repeated hereinbelow, and differences between them will now be focused on and described.

Referring to FIGS. 2 and 10, in operation P110, a photoresist may be provided to a wafer W. The photoresist may be provided by the aforementioned adhesion promotion and the aforementioned spin coating.

Then, in P120, an exposure process may be performed on the wafer W. The execution of the exposure process may include obtaining a model function indicating a difference between a designed pattern of an arbitrary element previously formed on the wafer W based on the alignment mark AGNM of FIG. 3A and an actually-implemented pattern as described above.

In P130, a photoresist pattern may be formed on the wafer W by a developing process.

In P140, the wafer W may be inspected. The inspection of the wafer W is similar to that described above with reference to FIGS. 4 through 9, but may be an after-development inspection, which is an inspection after the developing process and before an etch process. Accordingly, an overlay obtained in P140 may indicate a misalignment between a circuit pattern previously formed on the wafer W and the photoresist pattern.

Then, in P150, an exposure process may be evaluated. The evaluation of the exposure process may include comparing an overlay value with an allowable critical value. When a result of the evaluation of the exposure process is within a critical range (G), a subsequent process may be performed, in P160. The subsequent process may include etching, ion injection, deposition, and the like. On the other hand, when the result of the evaluation of the exposure process is not within the critical range (NG), the photoresist pattern may be removed in P145, and the method may proceed to P110 to provide a photoresist material layer again.

According to some embodiments, after the method proceeds to P110 to provide a photoresist material layer again and the exposure process is performed in P120, a photoresist pattern may be formed, in P130. The alignment and exposure process in P120 may depend on a result of inspecting the wafer W in P140. In other words, the alignment and exposure process in P120 may be an alignment and exposure process compensated by an overlay model for the same wafer W. Accordingly, the overlay of lithography that is performed again is improved, and thus, the reliability and manufacturing yield of the manufacture of a semiconductor device may be improved.

Further processes may be performed on the wafer W, for example to form a semiconductor device. For example, additional conductive and insulating layers may be deposited on the wafer W to form semiconductor chips, the semiconductor chips may then be singulated, packaged on a package substrate, and encapsulated by an encapsulant to form a semiconductor package.

According to embodiments, re-execution of the lithography process on the wafer W based on the after-development inspection has been described. However, this description is equally applicable to the lot-to-lot process control described with reference to FIGS. 1 through 9 and the wafer-to-wafer process control.

Figure 11:
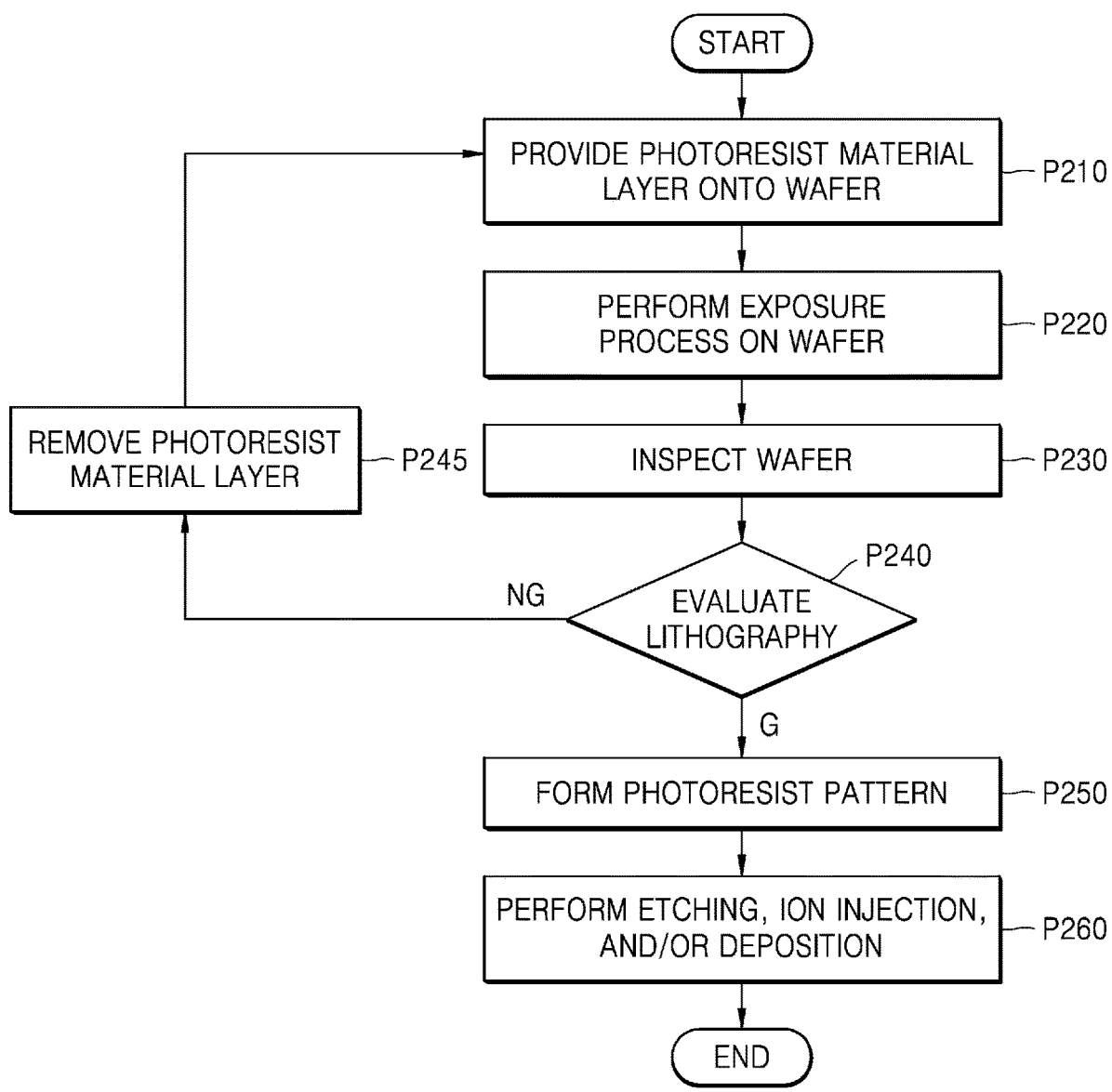

FIG. 11 is a flowchart of a method of manufacturing a semiconductor device, according to other embodiments.

For convenience of explanation, a description of FIG. 11 that is the same as or similar to that given above with reference to FIG. 10 will not be repeated hereinbelow, and differences between them will now be focused on and described.

Referring to FIGS. 11, P210 and P220 may be substantially the same as P110 and P120 described above with reference to FIG. 10, respectively.

According to some embodiments, in P230, a wafer may be inspected. According to some embodiments, the inspection of the wafer may include obtaining an overlay of a photoresist material layer after exposure before development. In this case, a refractive index difference between exposed portions of the photoresist material layer and non-exposed portions thereof may be very small. Thus, a latent image of the photoresist material layer before development has very low contrast. According to some embodiments, before the inspection is performed, contrast between the exposed portions and non-exposed portions of the photoresist material layer may be increased by an after-exposure bake process.

The inspection of the wafer in P230 may be similar to the inspection of the wafer in P30. As the inspection of the wafer in P230 is performed, an overlay between a latent image formed on the photoresist material layer and a semiconductor layer where a circuit pattern has been already formed may be measured, and an overlay model indicating an overlay of an arbitrary element on the wafer W may be obtained based on the value of the measured overlay.

Then, in P240, a lithography process may be evaluated. The evaluation of the lithography process may include comparing the overlay with an allowable critical value (G).

When the overlay is less than or equal to the allowable critical value (G), a photoresist pattern may be formed through development in P250, and a subsequent process such as etching, ion injection, and/or deposition may be performed in P260.

On the other hand, when the overlay exceeds the allowable critical value (NG), the photoresist material layer may be removed in P245, and, similar to FIG. 10, P210 through P230 may be performed again. In this case, the exposure process in P220 may be performed to correct the overlay model calculated in P230.

Further processes may be performed on the wafer W, for example to form a semiconductor device. For example, additional conductive and insulating layers may be deposited on the wafer W to form semiconductor chips, the semiconductor chips may then be singulated, packaged on a package substrate, and encapsulated by an encapsulant to form a semiconductor package.

According to embodiments, re-execution of the lithography process on the wafer W based on an inspection after exposure before development has been described. However, this description is equally applicable to the lot-to-lot process control described with reference to FIGS. 1 through 9 and the wafer-to-wafer process control.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor device, the method comprising:
    transferring an internal shot and an external shot by performing a lithography process and a patterning process based on the lithography process on a first wafer, wherein the internal shot is within a critical radius from a center of the first wafer, and the external shot includes a first region within the critical radius from the center of the first wafer and a second region outside the critical radius;
    measuring an overlay of the first wafer patterned by the patterning process;
    analyzing the overlay of the first wafer; and
    performing a lithography process on a second wafer, based on the analyzing of the overlay of the first wafer,
    wherein the analyzing of the overlay of the first wafer comprises:
        providing, to the first region, first augmented overlays generated based on an orthogonal coordinate system using first and second directions perpendicular to each other as an axis; and
        providing, to the second region, second augmented overlays that are overlays in a radial direction from the center of the first wafer.

2. The method of claim 1, wherein locations of the first augmented overlays and locations of the second augmented overlays are aligned in the first and second directions to constitute a grid.

3. The method of claim 1, further comprising:
    before the providing of the second augmented overlays, processing overlays of the second region such that the overlays are parallel to the radial direction.

4. The method of claim 1,
    wherein a plurality of external shots are transferred to the first wafer, and
    wherein the second augmented overlays are provided by interpolation based on the measured overlays of the plurality of external shots.

5. The method of claim 4, wherein the first augmented overlays of each of the external shot are provided based on the measured overlays of corresponding one of the plurality of external shots.

6. The method of claim 1, wherein the second augmented overlays are generated by spline interpolation.

7. The method of claim 1, wherein the second augmented overlays are generated by interpolation using a radial distance from the center of the first wafer as a single parameter.

8. The method of claim 1, further comprising:
    calculating an overlay model function over an entire surface of the external shot, based on the first and second augmented overlays.

9. A method of manufacturing a semiconductor device, the method comprising:
    transferring a circuit pattern on an extreme ultraviolet (EUV) photomask to a photoresist layer formed on a wafer, wherein a plurality of shots that are portions of the wafer to which the circuit pattern on the EUV photomask has been transferred include a first region within a critical radius from a center of the wafer and a second region outside the critical radius;
    forming a photoresist pattern having a shape corresponding to the EUV photomask, by developing the photoresist; and
    inspecting the photoresist pattern,
    wherein the inspecting of the photoresist pattern comprises:
        measuring overlays indicating misalignment between a pattern formed below a photoresist of the second region and the photoresist pattern;
        processing the overlays of the second region such that the overlays of the second region are parallel to a radial direction; and
        providing, to a plurality of locations on the second region, first augmented overlays in the radial direction from the center of the wafer, based on the processed overlays.

10. The method of claim 9, wherein the first augmented overlays of the second region extend in the radial direction.

11. The method of claim 9, wherein the first augmented overlays of the second region are based on the overlays in the second regions of the plurality of shots.

12. The method of claim 9, wherein the first augmented overlays of the second region are generated by interpolation using a radial distance from the center of the wafer as a single parameter.

13. The method of claim 9, further comprising:
    adding second augmented overlays to a plurality of locations on the first region, based on overlays of the first region.

14. The method of claim 13, wherein the second augmented overlays of the first region and the first augmented overlays of the second region are aligned in rows and columns to form a grid.

15. The method of claim 13, further comprising:
    calculating an overlay model representing an overlay for an arbitrary location of the shot, based on the first and second augmented overlays.

16. The method of claim 9, wherein, when the photoresist pattern is defective as a result of inspecting the photoresist pattern, the photoresist pattern is removed.

17. The method of claim 16, further comprising:
providing a photoresist onto the wafer again and exposing the wafer, based on a result of inspecting the wafer.

18. A method of manufacturing a semiconductor device, the method comprising:
transferring a circuit pattern on a photomask to a wafer, wherein each of a plurality of shots that are portions of the wafer to which the circuit pattern on the photomask has been transferred includes a first region within a critical radius from a center of the wafer and a second region outside the critical radius;
measuring overlays representing an interlayered misalignment of the plurality of shots;
providing first augmented overlays to the first region of a first shot from among the plurality of shots, based on overlays included in the first region of the first shot;
providing second augmented overlays to the second region of the first shot, based on overlays included in the plurality of shots; and
calculating an overlay model representing an overlay of an arbitrary location on the entire surface of the first shot by regression analysis of the first and second augmented overlays.

19. The method of claim 18, wherein at least some of the first augmented overlays extend in a direction intersecting with a radial direction with respect to the center of the wafer.

20. The method of claim 18, wherein the second augmented overlays extend in a radial direction with respect to the center of the wafer.

\* \* \* \* \*